United States Patent
Moon et al.

(10) Patent No.: US 10,931,142 B2
(45) Date of Patent: Feb. 23, 2021

(54) METHOD AND DEVICE FOR DETECTING ELECTRONIC DEVICE CONNECTED TO SMART PLUG

(71) Applicant: SAMSUNG ELECTRONICS CO., LTD., Suwon-si (KR)

(72) Inventors: Joongki Moon, Seoul (KR); Yangdon Lee, Seongnam-si (KR); Kyungjin Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 15/755,230

(22) PCT Filed: Aug. 26, 2016

(86) PCT No.: PCT/KR2016/009528
§ 371 (c)(1),
(2) Date: Feb. 26, 2018

(87) PCT Pub. No.: WO2017/034371
PCT Pub. Date: Mar. 2, 2017

(65) Prior Publication Data
US 2018/0262046 A1    Sep. 13, 2018

(30) Foreign Application Priority Data

Aug. 26, 2015  (KR) .................. 10-2015-0120444

(51) Int. Cl.
*H02J 13/00*       (2006.01)
*G08C 17/02*      (2006.01)
(Continued)

(52) U.S. Cl.
CPC .......... *H02J 13/0075* (2013.01); *G01R 11/04* (2013.01); *G01R 22/063* (2013.01); *G08C 17/02* (2013.01); *G08C 19/02* (2013.01)

(58) Field of Classification Search
None
See application file for complete search history.

(56) References Cited

U.S. PATENT DOCUMENTS 10,012,963 B2 *  7/2018  Lu .................. G05B 19/0423
2011/0049984 A1 *  3/2011  Son ..................... H02J 3/14
                                                    307/31
(Continued)

FOREIGN PATENT DOCUMENTS

KR         10-1182050 B1      9/2012
KR      10-2013-0048358 A     5/2013
(Continued)

OTHER PUBLICATIONS

Search Report dated Dec. 8, 2016, issued by the International Searching Authority in counterpart International Patent Application No. PCT/KR2016/009528 (PCT/ISA/210).
(Continued)

*Primary Examiner* — Lina M Cordero
(74) *Attorney, Agent, or Firm* — Sughrue Mion, PLLC

(57) ABSTRACT

The present disclosure relates to a technology for a sensor network, machine to machine (M2M) communication, machine type communication (MTC), and the Internet of Things (IoT). The present disclosure can be utilized in an intelligent service (such as smart home, smart building, smart city, smart car or connected car, health care, digital education, retail business, security and safety-related services) based on the technology. A gateway device according to the present disclosure determines whether additional power consumption information on an electronic device is needed, makes a request for the additional power consumption information to a smart plug when the additional power consumption information is determined to be necessary, determines the maximum number of smart plugs capable of transmitting the additional power consumption information
(Continued)

to the gateway device, and controls data transmission of at least a part of smart plugs transmitting the additional power consumption information to the gateway device.

12 Claims, 17 Drawing Sheets

(51) Int. Cl.
    *G08C 19/02*     (2006.01)
    *G01R 11/04*     (2006.01)
    *G01R 22/06*     (2006.01)

(56) References Cited

U.S. PATENT DOCUMENTS

| | | |
|---|---|---|
| 2011/0320636 A1 | 12/2011 | Young et al. |
| 2012/0221718 A1 | 8/2012 | Imes et al. |
| 2012/0223840 A1* | 9/2012 | Guymon .................. H04B 3/54 340/870.02 |
| 2014/0002057 A1* | 1/2014 | Ting ...................... G01R 21/00 324/96 |
| 2014/0067143 A1* | 3/2014 | Chen .................... G01R 21/133 700/291 |
| 2014/0248802 A1 | 9/2014 | Hieda et al. |
| 2015/0162960 A1* | 6/2015 | Coffey .................. H04L 5/0032 370/329 |
| 2015/0205316 A1* | 7/2015 | Choi ........................ H02J 3/14 700/295 |
| 2015/0253364 A1* | 9/2015 | Hieda ...................... H04Q 9/00 702/62 |
| 2016/0327598 A1 | 11/2016 | Seo |
| 2017/0127387 A1* | 5/2017 | Breuer .................. H04W 36/26 |
| 2020/0174084 A1* | 6/2020 | Seo ...................... G01R 19/165 |

FOREIGN PATENT DOCUMENTS

| | | |
|---|---|---|
| KR | 10-2015-0055344 A | 5/2015 |
| WO | 2013/022035 A1 | 2/2013 |

OTHER PUBLICATIONS

Written Opinion dated Dec. 8, 2016, issued by the International Searching Authority in counterpart International Patent Application No. PCT/KR2016/009528 (PCT/ISA/237).

* cited by examiner

FIG. 10
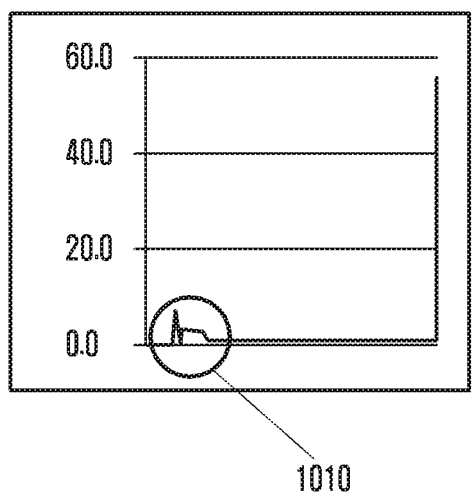
1010
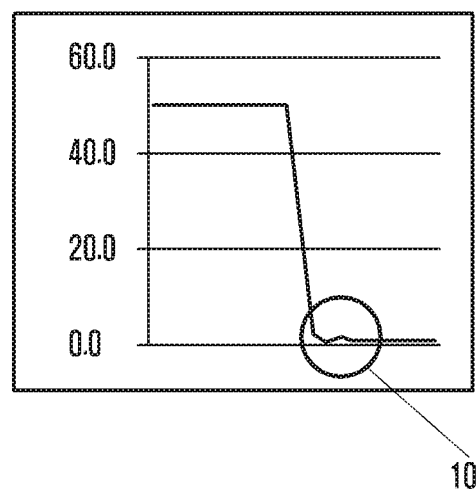
1020

FIG. 12
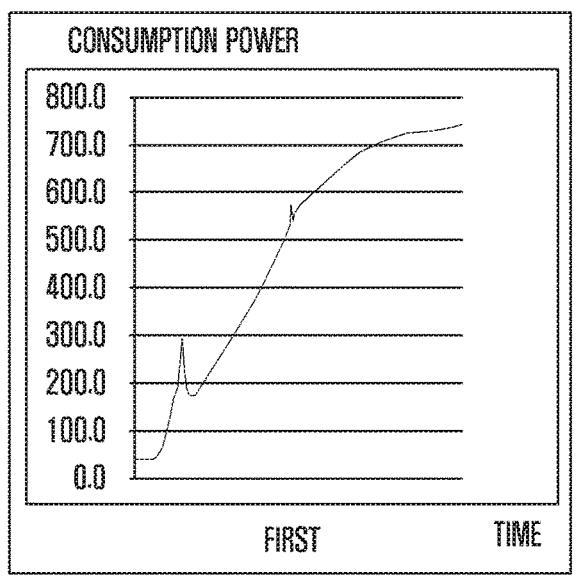
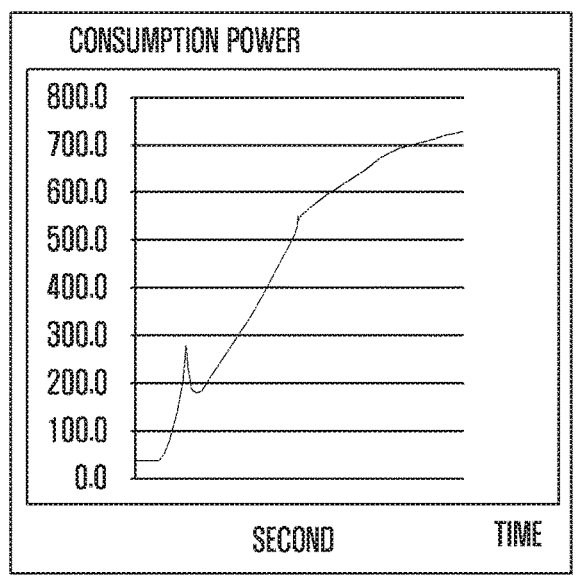
(a)
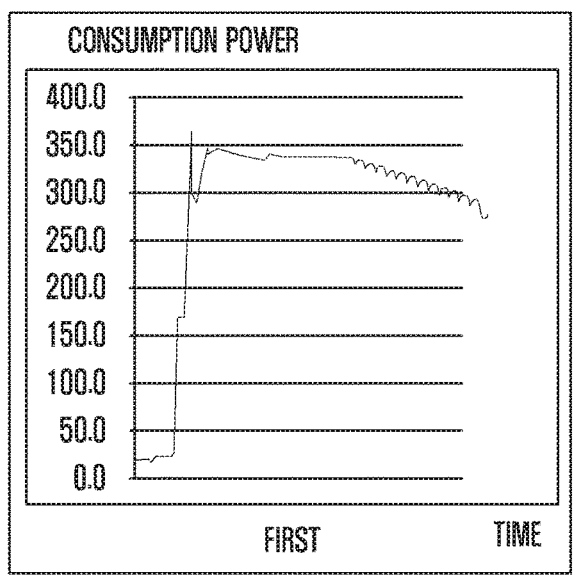
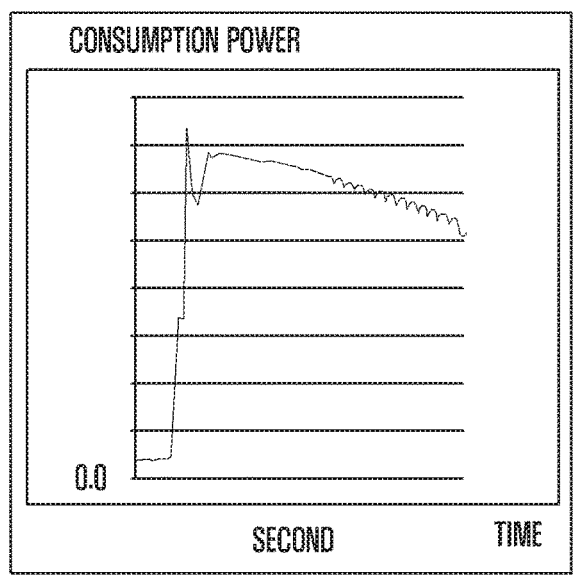
(b)

METHOD AND DEVICE FOR DETECTING ELECTRONIC DEVICE CONNECTED TO SMART PLUG

TECHNICAL FIELD

The present invention relates to a method and device detecting an electronic device connected to a smart plug and, more particularly, to a method and device, wherein after a smart plug transmits power consumption information of an electronic device to a gateway device, a user receives information about the electronic device from the gateway device.

BACKGROUND ART

The Internet evolves from a human-centered connection network over which human generates and consumes information to the Internet of Things (IoT) network over which distributed elements, such as things, exchange and process information. An Internet of Everything (IoE) technology in which a big data processing technology through a connection with a cloud server has been combined with the IoT technology is also emerging. In order to implement the IoT, technical elements, such as a sensing technology, wired/wireless communication and network infra, a service interface technology, and a security technology, are required. Accordingly, recently, research is carried out on technologies, such as a sensor network, machine to machine (M2M), and machine type communication (MTC).

In the IoT environment, an intelligent Internet Technology (IT) service in which a new value for human life is created by collecting and analyzing data generated by connected things may be provided. The IoT may be applied to fields, such as a smart home, a smart building, a smart city, a smart car or connected car, a smart grid, health care, smart home appliances and advanced medical services, through convergence and combination between the existing information technology (IT) and various industries.

A smart plug is located between the plug of an electronic device and a socket installed in a wall, and it measures consumption power when the electronic device is turned on and notifies a device (home energy manager) that provides service based on power consumption information of the electronic device or a user of the measured consumption power. The user or the home energy manager can efficiently use or reduce energy in the home using the obtained consumption power for each electronic device. Hereinafter, the home energy manger manager may be interchangeably used with a gateway device or a host device.

In order for the home energy manager or a user to receive information about consumption power for each electronic device in the home, a process of checking an electronic device connected to a smart plug and registering the electronic device is necessary. To this end, an application for an invention in which an electronic device is automatically recognized without the intervention of a user or an administrator has been filed.

DISCLOSURE

Technical Problem

Each smart plug may identify an electronic device connected thereto based on power consumption information of the connected electronic device and transmit information about the identified electronic device for device registration to a gateway device. In this case, each smart plug requires hardware specifications of a specific level or more in order to perform a device recognition algorithm. For example, a micro controller unit (MCU) performance, flash capacity, RAM capacity and computation ability of a specific level or more are required, which leads to a rise of a manufacturing cost.

The present invention proposes a method of performing an operation of changing and recognizing an electronic device in a gateway device not in each smart plug as a method of receiving data from a plurality of smart plugs and processing the data while minimizing the upgrade of hardware and the development of software. The present invention provides a method of preventing power data transmitted from a plurality of smart plugs to a gateway device from being excessively increased.

The present invention provides a method of transmitting a large amount of power data measured from a plurality of smart plugs (terminals) to a host device without a loss of the power data so that the type of electronic device connected to the terminals is to automatically sensed/registered to minimize the intervention of a user.

Technical Solution

A method for a gateway to control the data transmission of a smart plug according to an embodiment of the present invention includes the steps of periodically receiving power consumption information of an electronic device connected to a smart plug; determining whether additional power consumption information for the electronic device is necessary based on the received power consumption information; requesting the additional power consumption information from the smart plug if it is determined that the additional power consumption information is necessary; determining a maximum number of smart plugs capable of transmitting the additional power consumption information to the gateway device; determining whether the number of smart plugs transmitting additional power consumption information to the gateway device is greater than the maximum number; and controlling the data transmission of at least some of the smart plugs transmitting the additional power consumption information to the gateway device if the number of smart plugs transmitting the additional power consumption information to the gateway device is greater than the maximum number.

A method for a smart plug to transmit/receive data to/from a gateway device according to an embodiment of the present invention includes the steps of periodically measuring power consumption information of an electronic device connected to a smart plug; transmitting the measured power consumption information to a gateway device; receiving a request for additional power consumption information for the electronic device from the gateway device; determining whether there is a possibility that the electric device has changed based on characteristics of the electronic device and the power consumption information; and transmitting the additional power consumption information to the gateway device if there is a possibility that the electronic device has changed.

A gateway device controlling the data transmission of a smart plug according to an embodiment of the present invention includes a communication unit transmitting/receiving data to/from a smart plug; and a controller periodically receiving power consumption information of an electronic device connected to a smart plug, determining whether additional power consumption information for the electronic device is necessary based on the received power consumption information, requesting the additional power consumption information from the smart plug if it is determined that the additional power consumption information is necessary, determining a maximum number of smart plugs capable of transmitting the additional power consumption information to the gateway device, determining whether the number of smart plugs transmitting additional power consumption information to the gateway device is greater than the maximum number, and controlling the data transmission of at least some of the smart plugs transmitting the additional power consumption information to the gateway device if the number of smart plugs transmitting the additional power consumption information to the gateway device is greater than the maximum number.

A smart plug transmitting/receiving data to/from a gateway device according to an embodiment of the present invention includes a communication unit transmitting/receiving data to/from a gateway device; and a controller periodically measuring power consumption information of an electronic device connected to a smart plug, transmitting the measured power consumption information to a gateway device, receiving a request for additional power consumption information for the electronic device from the gateway device, determining whether there is a possibility that the electric device has changed based on characteristics of the electronic device and the power consumption information, and transmitting the additional power consumption information to the gateway device if there is a possibility that the electronic device has changed.

Advantageous Effects

The upgrade of hardware specifications of a smart plug and a rise of a manufacturing cost can be reduced because the execution of an algorithm for the recognition of an electronic device connected to a smart plug (power measuring device) is executed by a host device not the smart plug.

DESCRIPTION OF DRAWINGS

FIG. 10 shows a change of power of an electronic device in which fine power is consumed by only a plug connection.

FIG. 12 shows power patterns when an electronic device is turned on.

MODE FOR INVENTION

Figure 1:
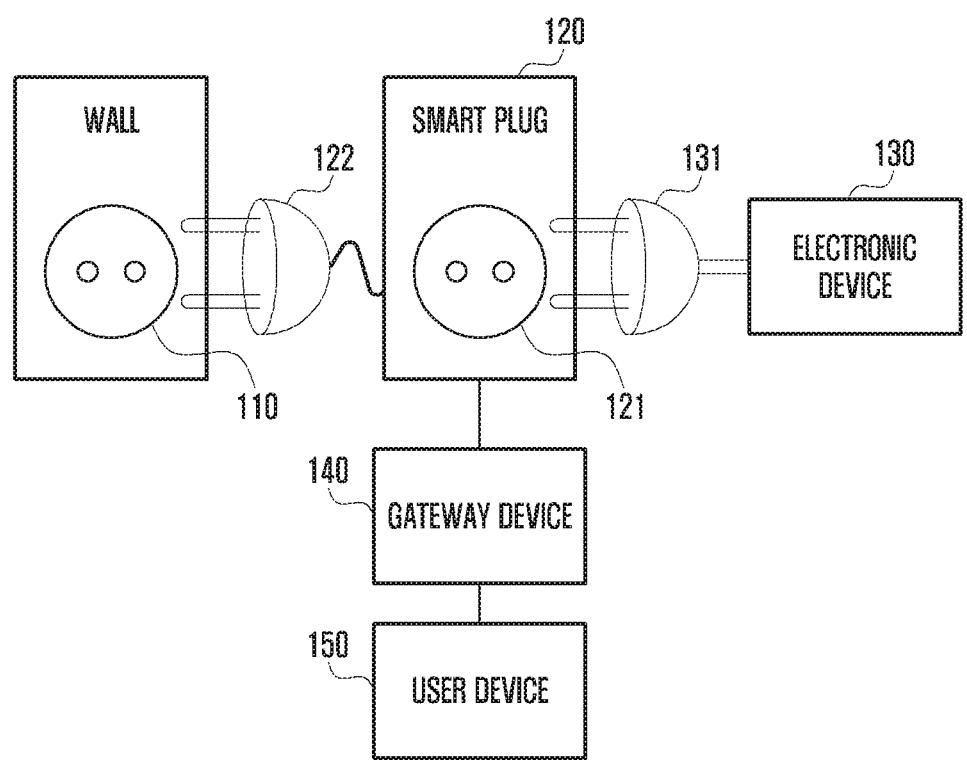
FIG. 1 shows the configuration of a system including a smart plug.

In this specification and the claims, "comprise" does not mean the exclusion of other elements or operations. In this specification and the claims, a singular noun may include a plural noun unless specifically described otherwise. In this specification and the claims, a "smart plug" may be interchangeably used with a power measuring device. In this specification and the claims, an "electronic device" is connected to the socket of a smart plug through a plug and includes home appliances. In this specification and the claims, a plug having 2 or 3 pins may be inserted into a "socket", and the plug have various forms depending on the shape, size and arrangement of the pins.

Hereinafter, various embodiments of the present invention are described with reference to the accompanying drawings. In the following description, only a portion necessary to understand an operation according to an embodiment of the present invention is described, and a description of other portions is simplified or omitted in order to prevent the gist of the present invention from making obscure. In this case, the characteristics of the present invention are not limited to the aforementioned examples and may also include a change in the form of each element and additional functions described hereunder. In the drawings, the size of some elements may have been enlarged for an example and is not shown in proportion to the size.

FIG. 1 shows the configuration of a system including a smart plug.

Referring to FIG. 1, the system may include a socket 110, a smart plug 120, an electronic device 130, a gateway device 140 and a user device 150.

In FIG. 1, the socket 110 has been illustrated as being installed in a wall, but is not limited thereto and may be located in a floor, ceiling or multi-tap. The smart plug 120 includes a socket 121 and a plug 122 and may transmit/receive data to/from the gateway device 140 in a wired or wireless manner. The electronic device 130 includes a plug 131, and the plug 131 may be inserted into the socket 121. The gateway device 140 may transmit/receive data to/from the smart plug in a wired or wireless manner. The gateway device 140 itself may include a display module and an input unit. The gateway device 140 may be connected to the user device 150 including a display module, for example, TV, a pad, a smartphone, a notebook or a refrigerator in a wired or wireless manner. A user may control the operation of the gateway device 140 through the input unit of the user device 150. In accordance with an embodiment of the present invention, the gateway device 140 may be attached or embedded in the smart plug 120 and turned on. In accordance with an embodiment of the present invention, when the user device 150 moves to the distance in which it can perform short-distance communication (e.g., Bluetooth or WiFi) with the gateway device 140, the gateway device 140 may transmit device information of the electronic device 130 to the user device 150 without a request from the user device 150. In this case, the user device 150 may display the device information of the electronic device 130 through a display.

Figure 2:
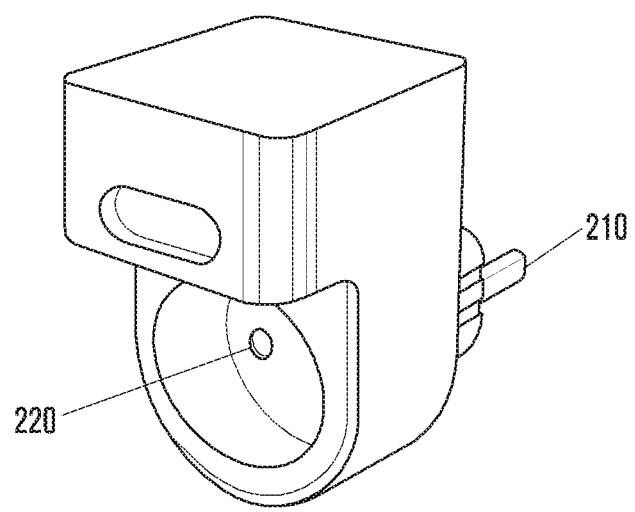
FIG. 2 shows an embodiment of an external appearance of the smart plug.

FIG. 2 shows an embodiment of an external appearance of the smart plug.

As shown in FIG. 2, the smart plug 120 includes a plug 210 and a socket 220. The plug 210 and the socket 220 commonly have the same type, but may have different types. For example, the plug 210 includes two pins of a cylindrical shape, whereas the socket 220 may have a structure capable of receiving three pins of a flat rectangular parallelepiped shape. The plug 210 and the socket 220 may be formed to be compatible with several types. In FIG. 2, the smart plug 120 has been illustrated as including a single socket, but may include two or more sockets. In this case, the gateway device may recognize that two or more smart plugs are present.

Figure 3:
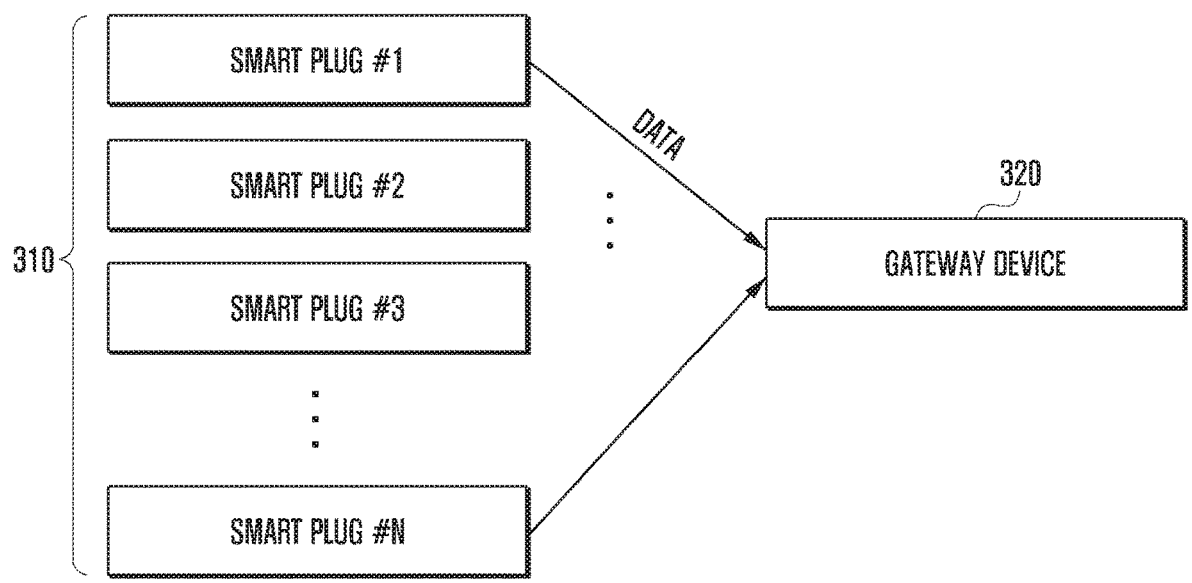
FIG. 3 shows data transmission from a plurality of smart plugs to a gateway device.

FIG. 3 shows data transmission from a plurality of smart plugs to a gateway device.

Each smart plug 310 may transmit power consumption information of an electronic device connected thereto to a gateway device 320. The power consumption information may be transmitted to the gateway device 320 every predetermined cycle (e.g., 1 minute or 2 minutes). The power consumption information may include the amount of power consumed for a predetermined period (e.g., 30 seconds or 1 minute). When a request from the gateway device 320 is received, each smart plug 310 may transmit additional power consumption information about an electronic device to the gateway device 320. The additional power consumption information is measured at a time interval (e.g., 0.1 second) denser than the power consumption information. Each smart plug 310 temporarily stores the measured additional power consumption information in an embedded buffer, and may transmit the stored additional power consumption information to the gateway device 320 when a request from the gateway device 320 is received.

The gateway device 320 may determine device information of electronic devices connected to each smart plug 310 based on the power consumption information, and may provide the device information to a user. The providing may be performed by displaying the device information on a display included in the gateway device 320 or transmitting the device information to a user device connected to the gateway device 320 in a wired or wireless manner. The device information may include information about the type of electronic device (e.g., an air-conditioner, a refrigerator, TV or a washing machine) and the operating state of the electronic devices. For example, ZigBee communication may be used as communication between each smart plug 310 and the gateway device 320.

Figure 4:
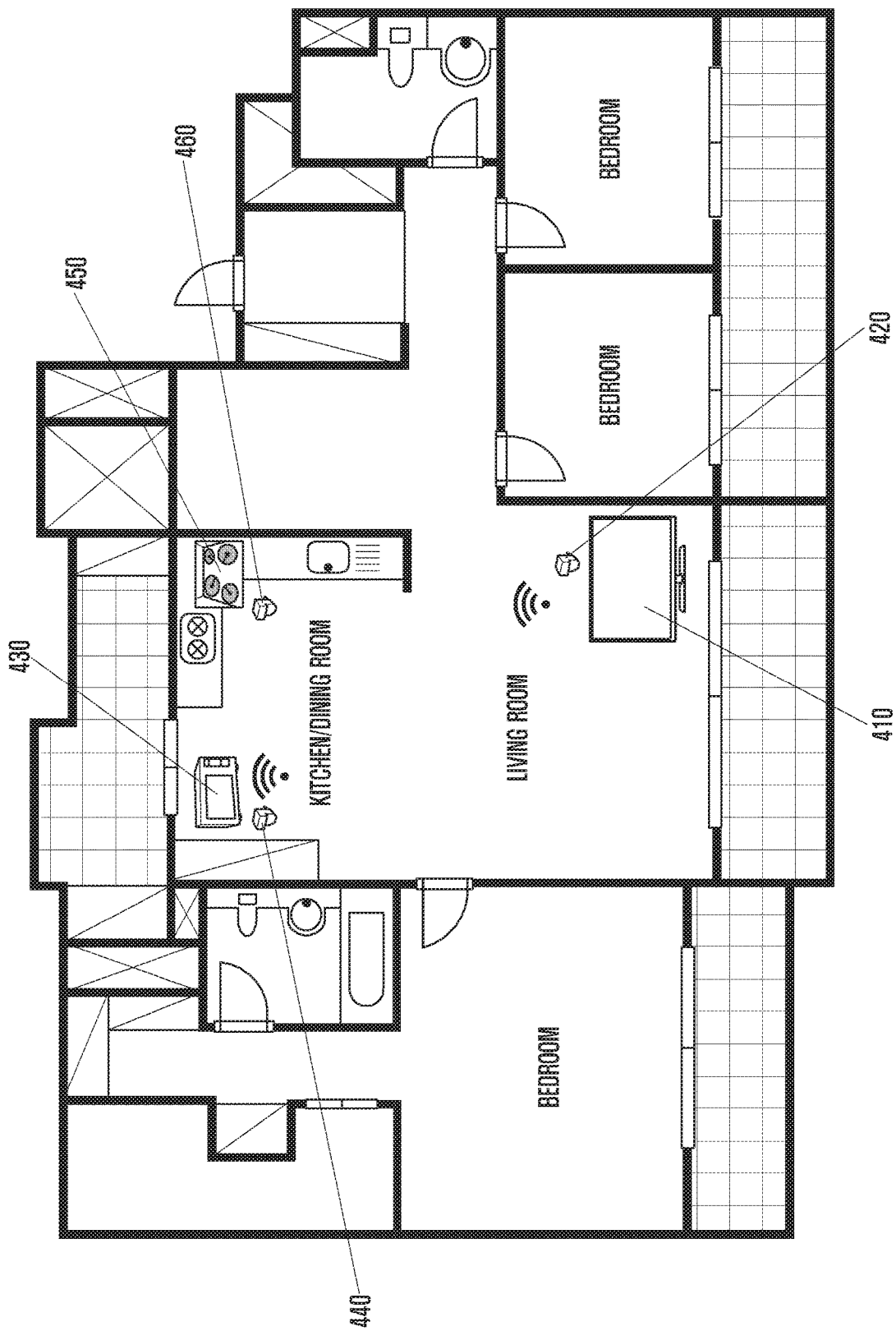
FIG. 4 shows an embodiment of the deployment of smart plugs in the home.

FIG. 4 shows an embodiment of the deployment of smart plugs in the home.

FIG. 4 shows that power of TV 410 is connected through a smart plug 420, power of a microwave oven 430 is connected through a smart plug 440, and power of a gas stove 450 is connected through a smart plug 460. In FIG. 4, assuming that the TV 410 is a gateway device, the smart plug 420, the smart plug 440 and the smart plug 460 may transmit/receive data to/from the TV 410 through wireless communication (e.g., ZigBee).

Figure 5:
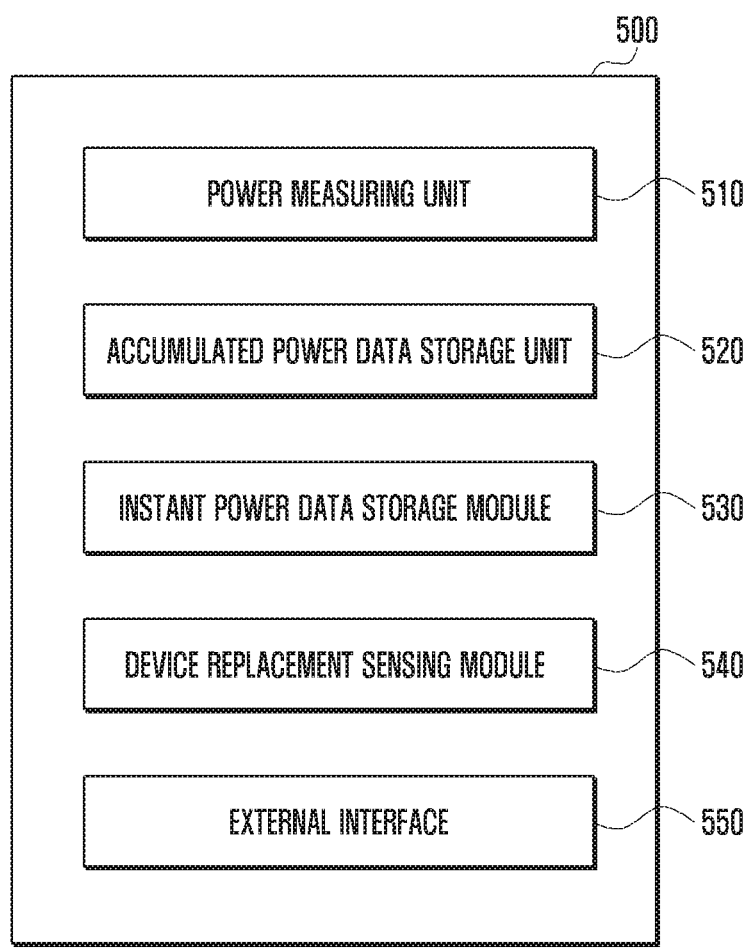
FIG. 5 shows an embodiment of the element modules of a smart plug.

FIG. 5 shows an embodiment of the element modules of a smart plug.

Referring to FIG. 5, the smart plug includes a power measuring unit 510, an accumulated power data storage unit 520, an instant power data storage unit 530, a device replacement sensing unit 540 and an external interface 550.

The power measuring unit 510 measures consumption power according to an electronic device connected to the smart plug. The accumulated power data storage unit 520 stores average power for a predetermined time (e.g., 1 minute). The instant power data storage unit 530 stores power data every predetermined time (e.g., 0.5 second). The power data stored in the instant power data storage unit 430 may include a momentary current, a momentary voltage, effective power and a power factor. The device replacement sensing unit 540 of the smart plug primarily determines whether an electronic device connected to the smart plug has been replaced so that the amount of data transmission to a gateway device is reduced. The device replacement sensing unit 540 determines whether an electronic device has been newly connected to the smart plug or an electronic device has been removed from the smart plug. The external interface 550 may perform wired or wireless communication through a gateway device. The instant power data storage unit 530 and the device replacement sensing unit 540 may be included in the micro controller unit (MCU) of the smart plug.

Figure 6:
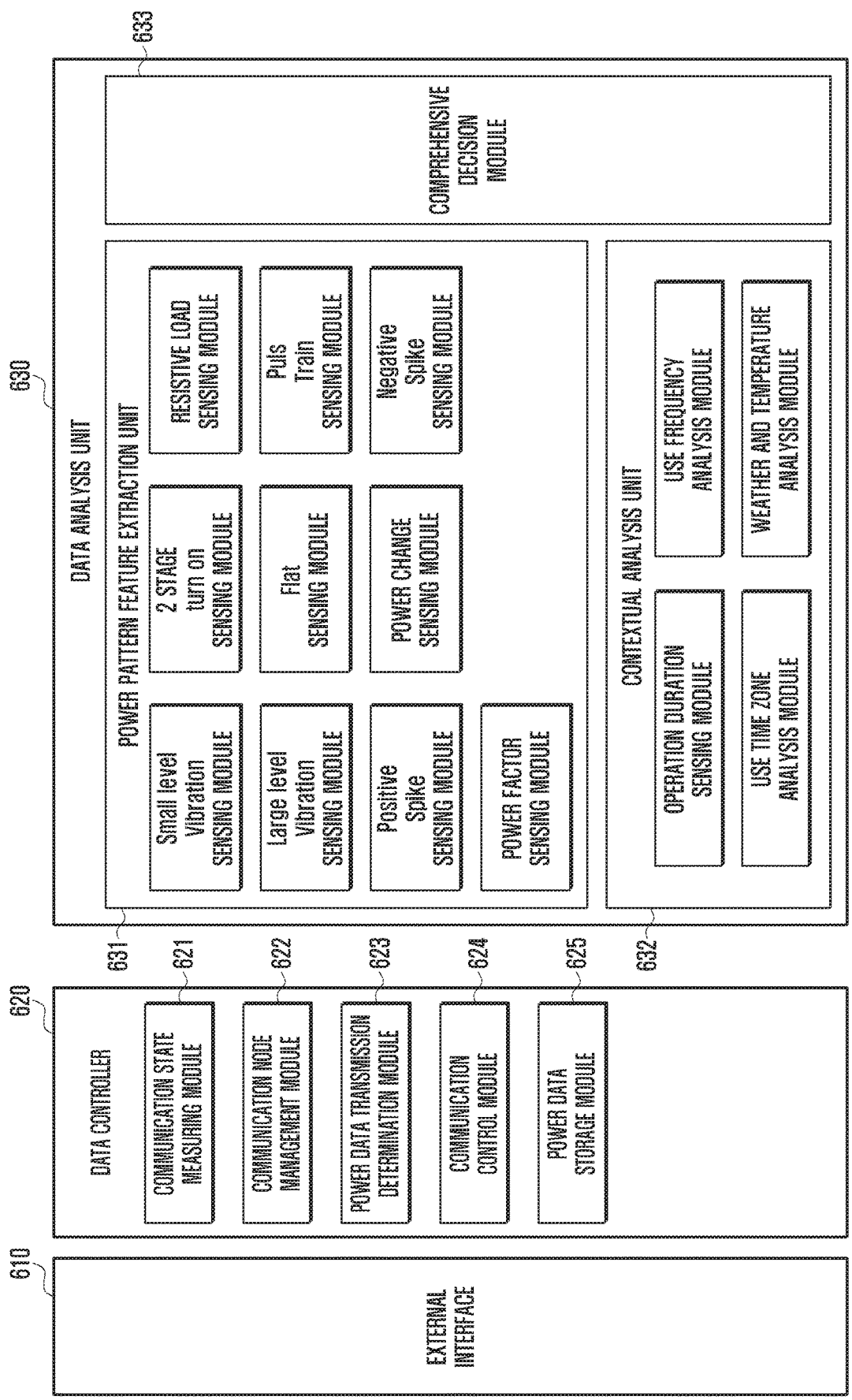
FIG. 6 shows an embodiment of the element modules of a gateway device.

FIG. 6 shows an embodiment of the element modules of a gateway device.

Referring to FIG. 6, the gateway device includes an external interface 610, a data controller 620 and a data analysis unit 630.

The external interface 610 may enable the gateway device to perform wired or wireless communication with one or more plugs and other devices. The data controller 620 may include a communication state measuring module 621, a communication node management module 622, a power data transmission determination module 623, a communication control module 624, and a power data storage module 625.

The communication state measuring module 621 predicts the number of plugs Nθ capable of stable real-time processing based on communication history data, such as a response time for a command and a communication retry number. The communication node management module 622 manages attributes related to the communication of each wireless device. For example, the communication node management module 622 determines whether a corresponding device is a device that provides control or only a state query service or a device (smart plug) that needs to transmit power data. The power data transmission determination module 623 determines whether power data necessary for device recognition needs to be transmitted, and prohibits unnecessary power data from being transmitted so that communication traffic is not generated. The communication control module 624 generates a control message so that power data can be efficiently and stably transmitted, and transmits/receives controls messages. The power data storage module 625 sequentially stores power data received from the data measuring device so that the received power data does not leak.

The data analysis unit 630 may include a power pattern feature extraction unit 631, a contextual analysis unit 632 and a comprehensive decision unit 633. An electronic device consumes power with a unique power pattern due to an internal device and operating characteristics that must be included therein when the corresponding device is designed. The power pattern feature extraction unit 631 may determine the type of electronic device based on the unique power consumption pattern. The type of electronic device may correspond to any one of a refrigerator, TV, a microwave oven, an iron, a vacuum cleaner, a washing machine, an air-conditioner, an audio device, a coffee port, a toaster, a cooktop, a drier, an electric heater, an electric cooker, a dishwasher and a personal computer (PC), for example. The contextual analysis unit 632 may analyze a surrounding environment of an electronic device and collect the surrounding environment as situation recognition information.

The situation recognition information may include information, such as operating duration of the electronic device, use frequency of the electronic device, the use time zone of the electronic device, humidity and temperature. The comprehensive decision unit 633 may determine that the electronic device is which type based on the stored power data and make various decisions, such as registering a determined type.

The blocks in FIGS. 5 and 6 are classified for convenience in terms of description and functions thereof are not necessarily classified as described above.

Figure 7:
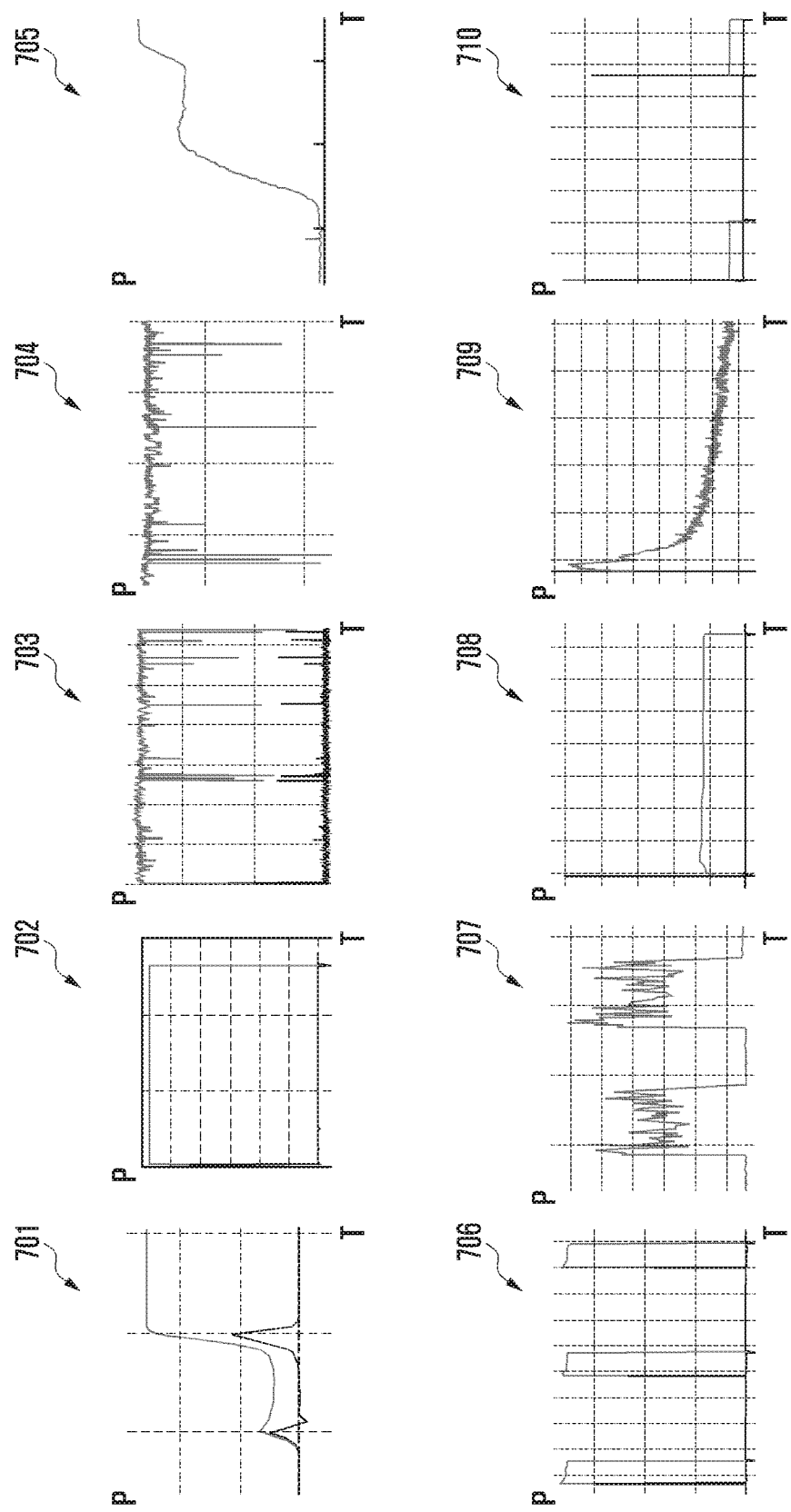
FIG. 7 shows an example of power patterns which may be sensed by a power pattern feature extraction unit.

FIG. 7 shows an example of power patterns which may be sensed by a power pattern feature extraction unit.

701 is 2-stage turn-on and may be determined to correspond to a case where after active power increases from off, it remains flat within 3 seconds, and the active power increases again and remains flat for 3 seconds. 702 is flat and may be determined to correspond to a case where the average of active power every 3 seconds has deviation of 5% or less. 703 is a small scale vibration and may be determined to correspond to a case where the number of peaks of 20 W or less is 10 or more for 3 seconds in a difference between neighboring active power. 704 is a negative spike and may be determined to correspond to a case where active power of 50 W or more maintains 30 W or less for 3 seconds and recovers again. 705 is gradual rising and may be determined to correspond to a case where an increase of the active power average in a 3-second unit is measured for 30 seconds or more. 706 is a pulse train and may be determined to correspond to a case where on-time of 1.5 second or m ore is maintained times or more and deviation of each on-time is 10% or less. 707 is a large scale vibration and may be determined to correspond to a case where a peak having a difference of 20 W or more between neighboring active power is greater than 5. 708 is a positive spike and chiefly caused by the initial startup of a motor, and may be determined to correspond to a case where twice or more active power when the motor is rotated at a constant speed is maintained for 3 seconds and reduced. 709 is gradual falling and may be determined to correspond to a case where a reduction of the active power average in a 3-second unit is monitored for 30 seconds or more. 710 illustrates an example of the repetition of a power pattern.

Patterns extracted by the power pattern feature extraction unit are not limited to the patterns illustrated in FIG. 7. The power pattern feature extraction unit may extract a pattern having a combination of two or more of the patterns illustrated in FIG. 7 or a pattern not illustrated in FIG. 7.

Figure 8:
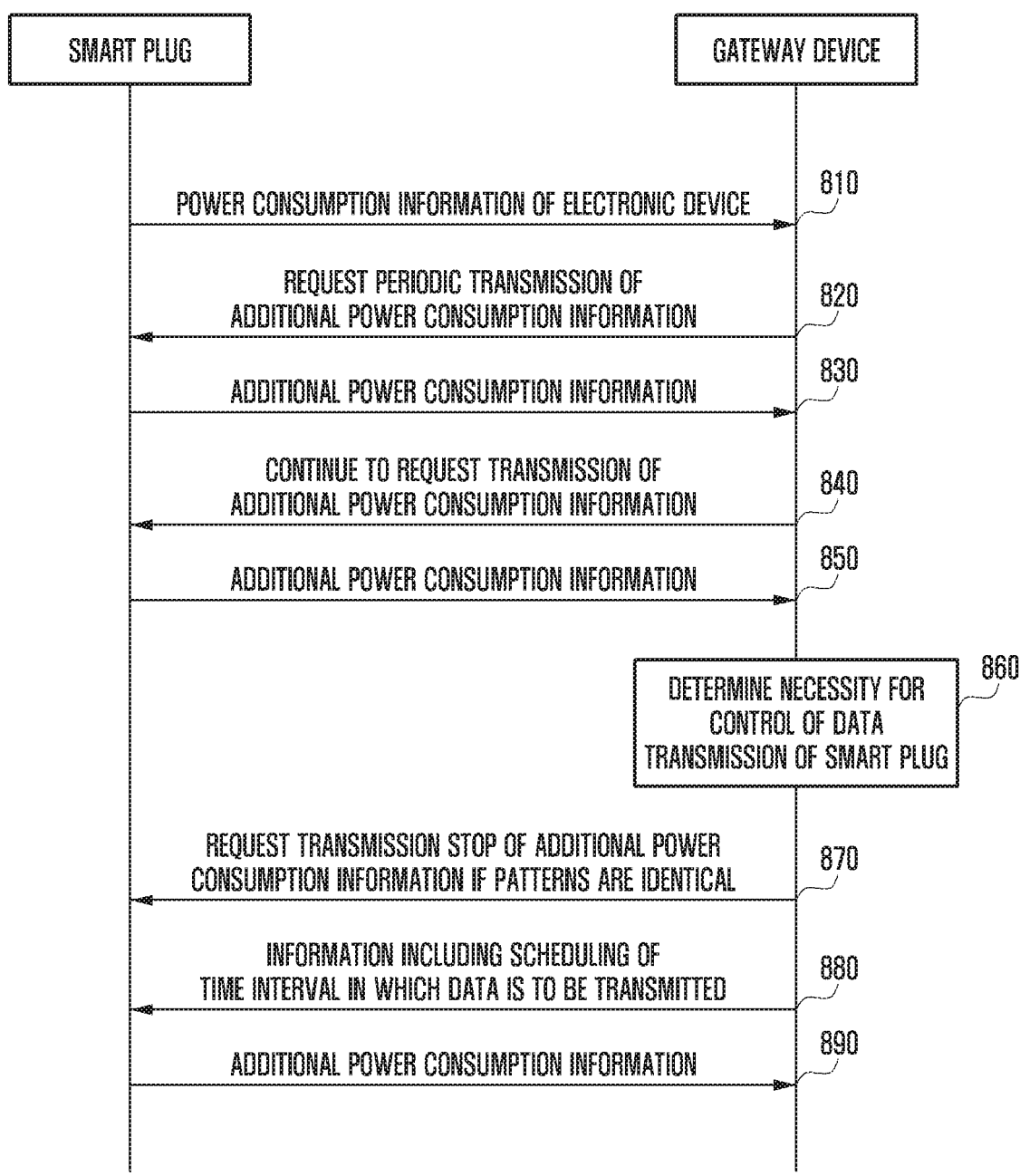
FIG. 8 shows data transmission/reception between a smart plug and a gateway device.

FIG. 8 shows data transmission/reception between the smart plug and the gateway device.

At step 810, the smart plug (power measuring device) periodically transfers power consumption information of an electronic device connected to the smart plug to the gateway device. At step 820, the gateway device requests the transmission of additional power information of the electronic device connected to the smart plug from the smart plug. At step 830, the smart plug transmits the additional power consumption information of the electronic device connected to the smart plug to the gateway device. At step 840, the gateway device continues to request the transmission of the additional power consumption information. At step 850, the smart plug transmits the additional power consumption information to the gateway device.

At step 860, the gateway device determines that control of the data transmission of the smart plug is necessary. In this case, at step 870, if a power pattern of the electronic device connected to the smart plug is the same as a previous power pattern of the electronic device of the smart plug based on the additional power consumption information of the corresponding smart plug, the gateway device determines that the electronic device has not changed and requests the transmission stop of the additional power consumption information from the corresponding smart plug. Independently of step 870 or after the execution of step 870, if it is determined that control of the data transmission of the smart plug will be necessary, at step 880, the gateway device transmits information, including the scheduling of a time interval in which data will be transmitted, to each smart plug. At step 890, the smart plug transmits the additional power consumption information based on the information received at step 880.

Figure 9:
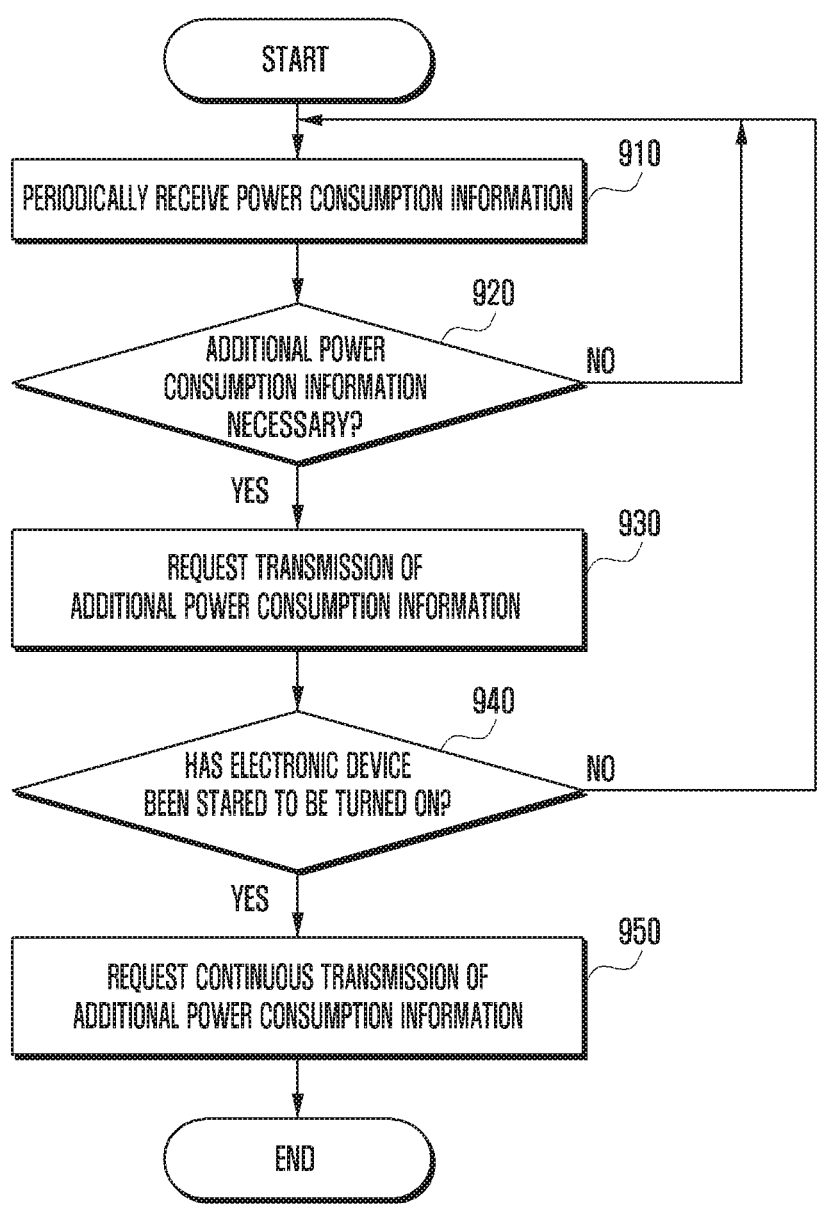
FIG. 9 shows an additional power consumption information request process by a gateway device.

FIG. 9 shows an additional power consumption information request process by the gateway device.

At step 910, the gateway device periodically receives power consumption information of an electronic device from a smart plug. The power consumption information may correspond to the amount of power consumed by the electronic device connected to the smart plug for a predetermined period (e.g., 1 minute). At step 920, the gateway device determines whether additional power consumption information is necessary for the electronic device based on the received power consumption information. For example, the gateway device may determine that the additional power consumption information is necessary if an increment of the amount of power consumed for a predetermined consecutive period is greater than a preset value (e.g., 0.2 Wh).

At step 930, if it is determined that the additional power consumption information is necessary, the gateway device requests the transmission of the additional power consumption information for the electronic device from the smart plug. The additional power consumption information may include at least one of a current, a voltage, effective power and a power factor measured at a high sampling rate (e.g., 5 times per 1 second). The smart plug that has received the request for the transmission of the additional power consumption information may determine whether it is necessary to transmit the additional power consumption information.

If it is autonomously determined that the electronic device to which the smart plug has been connected has not changed, the smart plug may determine that it is not necessary to transmit the additional power consumption information. In order to determine whether the connected electronic device has changed, the type and power of the connected electronic device now recognized by the smart plug may be taken into consideration. For example, if an electronic device connected to a smart plug corresponds to a device in which fine power is consumed by only a plug connection and a point of time at which power becomes 0 is not present in a change of power for a predetermined period, the smart plug determines that the electronic device has not changed and does not transmit additional power consumption information, thereby being capable of reducing the amount of power data transmission. For reference, if a mechanically driven fan or heater is connected, the smart plug cannot autonomously make the determination of whether an electronic device connected thereto has changed because such a fan or heater does not consume fine power by only a plug connection.

FIG. 10 shows a change of power of an electronic device in which fine power is consumed by only a plug connection.

From FIG. 10, it may be seen that an electronic device in which fine power is consumed by only a plug connection generates a spark by a plug connection 1010 and consumes fine power. Furthermore, it may be seen that the electronic device in which fine power is consumed by only a plug connection consumes fine power even after it is turned off (1020).

At step 940, when the additional power consumption information is received from the smart plug, the gateway device determines a point of time at which the electronic device is turned on based on the received additional power consumption information. For example, if effective power or current included in the received additional power consumption information has increased by a predetermined value or more for a predetermined time (e.g., 0.5 second), the gateway device may determine that the electronic device has started to be turned on. At step 950, if it is determined that the electronic device has started to be turned on, the gateway device continues to request the smart plug to transmit additional power consumption information after the point of time at which the electronic device started to be turned on. If the gateway device has not requested the transmission request of the additional power consumption information from the smart plug, it periodically receives only the power consumption information at step 910 from the smart plug.

In FIG. 9, the request at step 930 has been assumed to be made once, but a configuration may be performed so that the additional power consumption information continues to be transmitted until a separate request is made. In this case, if it is determined that the electronic device has started to be turned on at step 940, a separate request does not need to be made. If it is determined that the electronic device has started to be turned on at step 940, the transmission stop of the additional power consumption information needs to be requested.

Additional power consumption information power data transmitted by each smart plug in order to determine a device has a large amount and is continuously generated because it is data measured in a high sampling frequency. Accordingly, if the number of devices is many, the smooth transmission of the additional power consumption information power data becomes difficult. In order to prevent this, the present invention proposes a method for a gateway device to control the data transmission of smart plugs.

Figure 11:
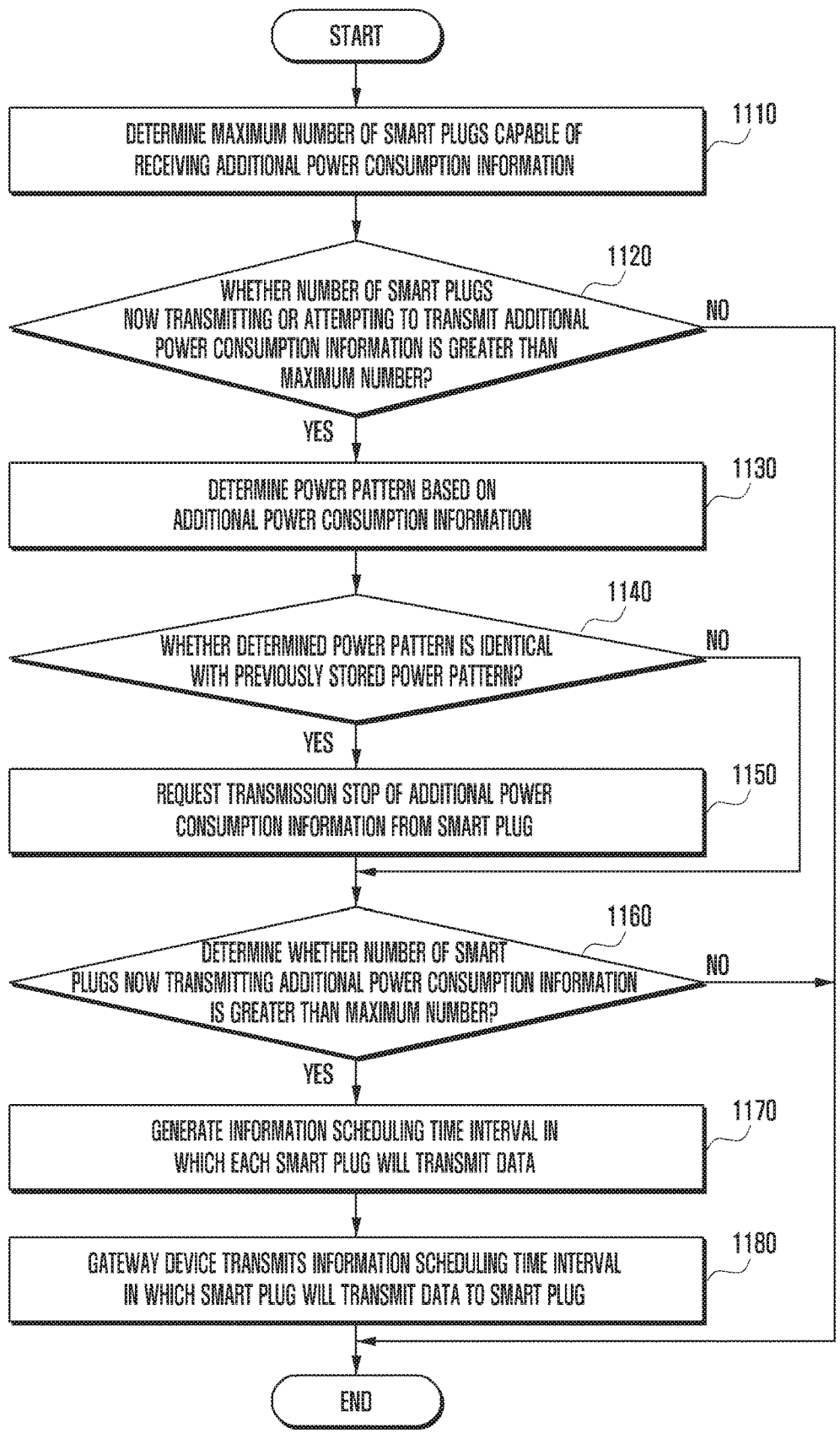
FIG. 11 shows a procedure for a gateway device to control the data transmission of a plurality of smart plugs.

FIG. 11 shows a procedure for the gateway device to control the data transmission of a plurality of smart plugs.

At step 1110, the gateway device determines a maximum number of smart plugs capable of receiving additional power consumption information based on a current communication environment. This may be performed by the communication state measuring module 621 of FIG. 6. The current communication environment may be determined based on the channel state between the smart plugs and the gateway device and the physical distance between the smart plugs and the gateway device. Specifically, alternatively, the current communication environment may be determined based on communication history data, such as a response time for a control command, a retry number, and an average value of response times for N recent commands.

At step 1120, the gateway device determines whether the number of smart plugs that now transmits or attempts to transmit additional power consumption information to the gateway device is greater than the maximum number (e.g., 5).

If the number of smart plugs that now transmits or attempts to transmit additional power consumption information to the gateway device is smaller than or equal to the maximum number, the gateway device performs data transmission according to a current method without separate control because the smart plugs now transmitting or attempting to transmit additional power consumption information can stably transmit the additional power consumption information.

If the number of smart plugs that now transmits or attempts to transmit additional power consumption information to the gateway device is greater than the maximum number, the gateway device does not recognize a device through data analysis, a transmission crash is frequently generated, a response time for a command becomes slow, or a communication retry number increases. In order to prevent the problems, the gateway device controls the data transmission of a smart plug. In order to control the data transmission of the smart plug, at step 1130, the gateway device may determine a power pattern based on additional power consumption information from the smart plug. The power pattern may be determined based on some section near a point of time at which an electronic device is turned on in the additional power consumption information. The gateway device may store the determined power pattern for a predetermined period or may store the power pattern until it is determined that the electronic device has changed.

At step 1140, whether the determined power pattern is the same as a power pattern previously stored with respect to the smart plug is determined. Since each electronic device has a unique power pattern whenever it is turned on, whether the electronic device has changed may be determined by a comparison between power patterns. This may be performed by the power data transmission decision unit 623 of FIG. 6.

FIG. 12 shows power patterns when an electronic device is turned on.

FIG. 12(*a*) shows power patterns measured twice when an air-conditioner is turned on, and FIG. 12(*b*) shows power patterns measured twice when a refrigerator is turned on. As may be seen from FIG. 12, the same kind of an electronic device has a similar power pattern when the electronic device is turned on. Meanwhile, if a power pattern determined with respect to the same electronic device does not have a previously stored power pattern, the power pattern may be determined to be not the same as the previously stored power pattern.

A large amount of data is necessary to determine a device using power data. However, whether an electronic device connected to a smart plug is the same as a previously used electronic device may be easily determined through only a comparison with a previously stored power pattern upon turning on the electronic device.

At step 1150, if the determined power pattern is the same as the previously stored power pattern, the gateway device determines that the electronic device has not changed with respect to the smart plug and requests the transmission stop of the additional power consumption information from the smart plug.

Step 1130 to step 1150 are performed on a smart plug that transmits additional power consumption information, thereby being capable of reducing the number of smart plugs that transmit data.

At step 1160, the gateway device determines whether the number of smart plugs now transmitting additional power consumption information is greater than the maximum number.

At step 1170, if the number of smart plugs now transmitting the additional power consumption information is still greater than the maximum number, the gateway device generates information that schedules a time interval in which each smart plug will transmit data. This may be performed by the communication control module 624 of FIG. 6.

Figure 13:
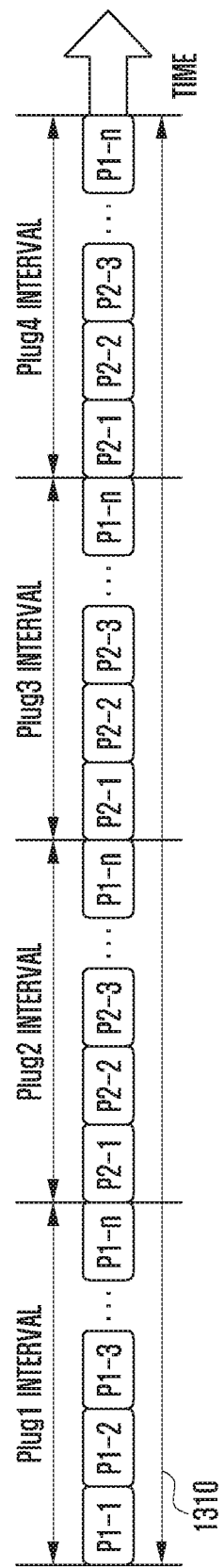
FIG. 13 shows that time intervals in which respective smart plugs will transmit data have been scheduled.

FIG. 13 shows that time intervals in which respective smart plugs will transmit data have been scheduled.

FIG. 13 shows that the number of smart plugs now transmitting additional power consumption information is 4 (Plug 1, Plug 2, Plug 3 and Plug 4), but is not limited thereto. The gateway device may allocate a time interval for the transmission of additional power consumption information to each smart plug. For example, 00 seconds~10 seconds of each minute may be allocated to the smart plug 1, 10 seconds~20 seconds of each minute may be allocated to the smart plug 2, 20 seconds~30 seconds of each minute may be allocated to the smart plug 3, and 30 seconds~40 seconds of each minute may be allocated to the smart plug 4. 40 seconds~60 seconds of each minute may be allocated for the transmission of information (control information, etc.) other than additional power consumption information or for the transmission of a smart plug other than the smart plugs 1-4. In this case, an allocation cycle 1310 is 1 minute, and a time region is allocated to each of the smart plugs 1-4 every 1 minute. Each smart plug may transmit packets in a time region allocated thereto. For example, the smart plug 1 may transmit n packets P1-1, P1-2, . . . , P1-n during a time region allocated thereto.

The time allocation of FIG. 13 is only an example, and the present invention is not limited thereto. For example, in order for control information other than power consumption information to be transmitted in real time without being influenced by the scheduling, time resources may be separately allocated between the packets or the control information may be implemented so that it is transmitted through frequency resources different from those of the packets.

At step 1180, the gateway device transmits information that schedules the time interval in which the smart plug will transmit data to the smart plug. Accordingly, the smart plug transmits additional power consumption information at time specified by the information specifying the time interval in which the smart plug will transmit data.

In accordance with another embodiment of the present invention, step 1130, step 1140 and step 1150 may be omitted. In accordance with another embodiment of the present invention, step 1160, step 1170 and step 1180 may be omitted. That is, only one of the procedure related to a determination of the identity of patterns and the procedure related to the information including the time interval in which data will be transmitted may be performed.

Figure 14:
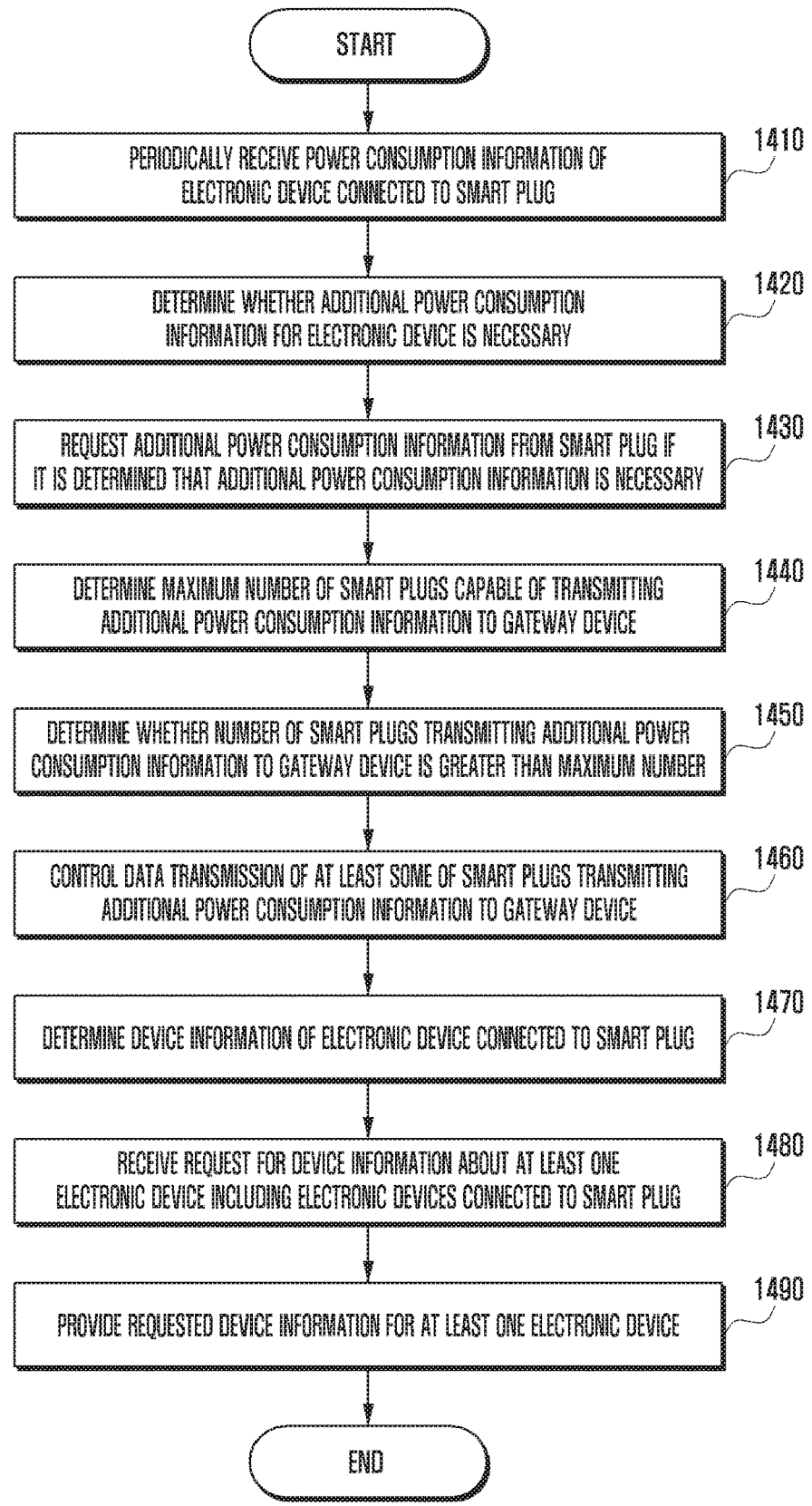
FIG. 14 shows a method for a gateway device to control the data transmission of a smart plug.

FIG. 14 shows a method for the gateway device to control the data transmission of a smart plug.

At step 1410, the gateway device periodically receives power consumption information of an electronic device connected to the smart plug from the smart plug.

At step 1420, the gateway device determines additional power consumption information for the electronic device is necessary based on the received power consumption information. For example, if an increment of the amount of power consumed by the electronic device for a predetermined period is greater than a predetermined first reference value, the gateway device determines that the additional power consumption information is necessary.

At step 1430, if it is determined that the additional power consumption information is necessary, the gateway device requests the additional power consumption information from the smart plug. Accordingly, the gateway device continuously receives the additional power consumption information for the electronic device from the smart plug.

At step 1440, the gateway device determines a maximum number of smart plugs capable of transmitting the additional power consumption information to the gateway device. At step 1450, the gateway device determines whether the number of smart plugs that transmit the additional power consumption information to the gateway device is greater than the maximum number.

At step 1460, if the number of smart plugs that transmit the additional power consumption information to the gateway device is greater than the maximum number, the gateway device controls the data transmission of at least some of the smart plugs that transmit the additional power consumption information to the gateway device. For example, the gateway device may determine a power consumption pattern for each smart plug based on additional power consumption information from the smart plug, may store the determined power consumption pattern, may determine whether the stored power consumption pattern is the same as previously stored power consumption pattern through a comparison, and may request the transmission stop of the additional power consumption information from the corresponding smart plug if it is determined that the stored power consumption pattern is the same as the previously stored power consumption pattern. Alternatively, the gateway device may generate information specifying a time interval in which data will be transmitted with respect to each smart plug, may transmit the generated information specifying the time interval in which data will be transmitted to the corresponding smart plug, and may receive data including the additional power consumption information from each smart plug based on the generated information specifying the time interval in which data will be transmitted.

At step 1470, the gateway device may determine device information of the electronic device connected to the smart plug based on the received additional power consumption information. At step 1480, the gateway device may receive a request for device information about at least one electronic device, including electronic devices connected to the smart plug. At step 1490, the gateway device may provide the requested device information for at least one electronic device.

Figure 15:
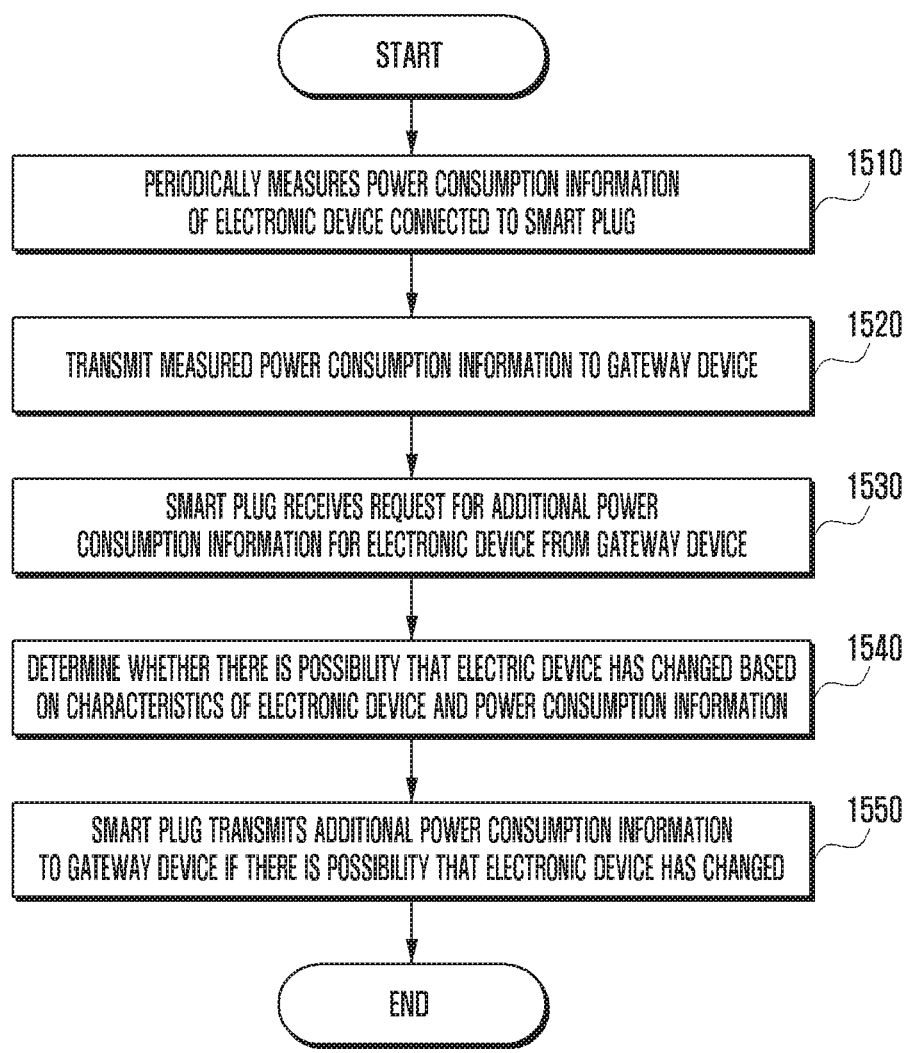
FIG. 15 shows a method for a smart plug to transmit/receive data to/from a gateway device.

FIG. 15 shows a method for a smart plug to transmit/receive data to/from a gateway device.

At step 1510, the smart plug periodically measures power consumption information of an electronic device connected to the smart plug. At step 1520, the smart plug transmits the measured power consumption information to the gateway device.

At step 1530, the smart plug receives a request for additional power consumption information for the electronic device from the gateway device. The additional power consumption information may include at least one of a current, a voltage, effective power and a power factor measured in a smaller cycle than the power consumption information.

At step 1540, the smart plug determines whether there is a possibility that the electric device has changed based on the characteristics of the electronic device and the power consumption information. For example, if the previously identified electronic device corresponds to a device in which fine power is consumed by only a plug connection and a point of time at which power is 0 in a change of power for a predetermined period is not present, the smart plug may determine that there is no possibility that the electronic device has changed. At step 1550, if there is a possibility that the electronic device has changed, the smart plug transmits the additional power consumption information to the gateway device.

Figure 16:
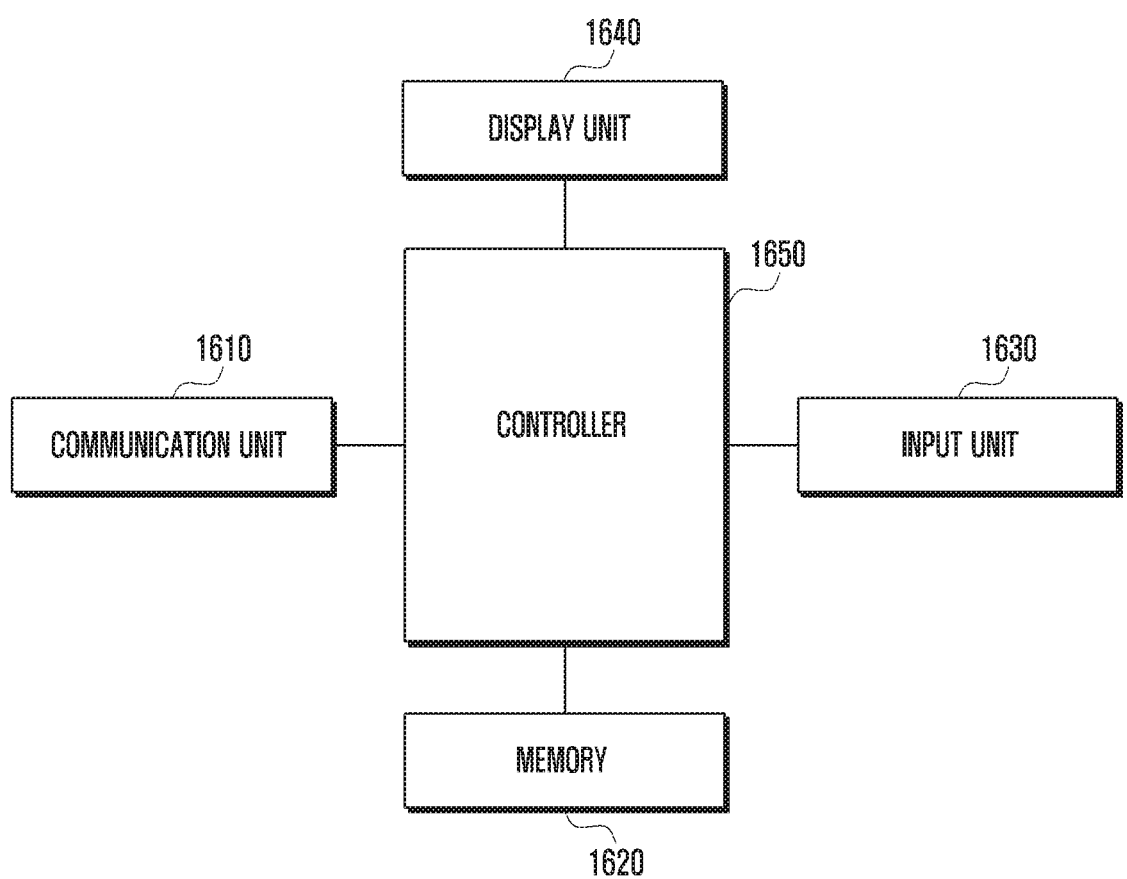
FIG. 16 shows the configuration of a gateway device.

FIG. 16 shows the configuration of the gateway device.

Referring to FIG. 16, the gateway device may include a communication unit 1610, a storage unit 1620, an input unit 1630, a display unit 1640 and a controller 1650.

The communication unit 1610 may transmit/receive data by performing communication with a user device or a smart plug. The data may include power consumption information or control information.

The storage unit 1620 may store information collected by the gateway device or separately input information. The storage unit 1620 may store an application program corresponding to a function capable of being performed in the gateway device and data generated when a function is performed in a terminal.

The input unit 1630 transfers signals, received in relation to function control of the gateway device and the setting of various functions, to the controller 1650. Furthermore, the input unit 1630 may be formed in a touch screen form or may be formed of a common key pad. Furthermore, the input unit 1630 may include function keys and soft keys.

The display unit 1640 may be formed of a liquid crystal display (LCD), light emitting diodes (LED) or organic light emitted diodes (OLED). The display unit 1640 may be disposed on or below a touch panel. For example, a touch screen may be implemented in a form in which it includes the touch panel on the display unit 1640. The display unit 1640 may display device information of an electronic device connected to a smart plug.

The controller 1650 controls overall state and operations of the elements that form the gateway device. The controller 1650 may control information received through the communication unit 1610 to be stored in the storage unit 1620. The controller 1650 may control other elements so that they perform various embodiments described in the present invention. For example, the controller 1650 may control the operation of FIG. 14.

Figure 17:
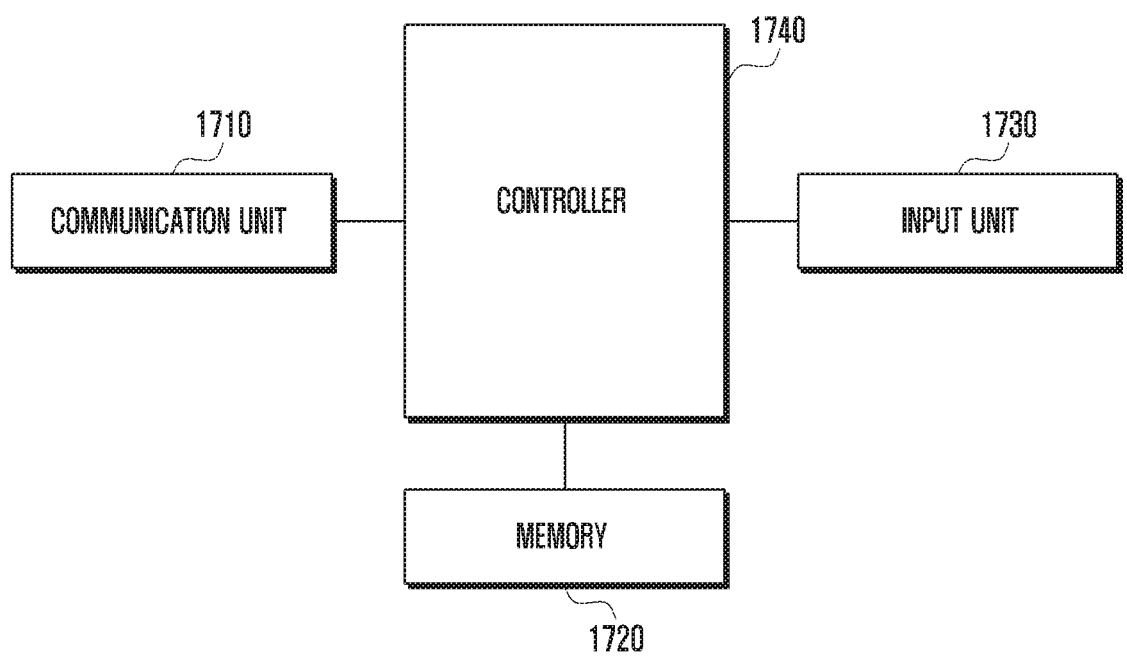
FIG. 17 shows the configuration of a smart plug.

FIG. 17 shows the configuration of a smart plug.

Referring to FIG. 17, the smart plug may include a communication unit 1710, a storage unit 1720, a sensing unit 1730 and a controller 1740.

The communication unit 1710 may transmit/receive data to/from the gateway device. The data may include power consumption information or control information. The storage unit 1720 may store information collected or received by the smart plug. The sensing unit 1730 may measure a voltage and current in order to collect power consumption information of an electronic device.

The controller 1740 controls overall state and operations of the elements forming the smart plug. The controller 1740 may control information received through the communication unit 1710 to be stored in the storage unit 1720. The controller 1740 may control other elements so that they perform various embodiments described in the present invention. For example, the controller 1740 may control the operation of FIG. 15.

In FIGS. 16 and 17, each of the gateway device and the smart plug has been illustrated as including a plurality of blocks and each block has been illustrated as performing a different function, but this is for only convenience in terms of description and the functions are not essentially divided as described above.

The methods according to the embodiments described in the claims or specification of the present invention may be implemented in the form of hardware, software or a combination of hardware and software.

The invention claimed is:

1. A method for a gateway device to control the data transmission of a smart plug, comprising:
periodically receiving, by the gateway device from the smart plug, power consumption information of an electronic device connected to the smart plug;
determining, by the gateway device, whether additional power consumption information of the electronic device is necessary based on the received power consumption information;
requesting, by the gateway device, the additional power consumption information from the smart plug if it is determined that the additional power consumption information is necessary;
determining, by the gateway device, a maximum number of smart plugs capable of transmitting the additional power consumption information to the gateway device;
determining, by the gateway device, whether a number of smart plugs transmitting the additional power consumption information to the gateway device is greater than the maximum number; and
controlling, by the gateway device, the data transmission of at least some of the smart plugs transmitting the additional power consumption information to the gateway device if the number of smart plugs transmitting the additional power consumption information to the gateway device is greater than the maximum number.

2. The method of claim 1, wherein the step of determining whether the additional power consumption information is necessary comprises a step of determining, by the gateway device, that the additional power consumption information is necessary if an increment of an amount of power consumed by the electronic device for a predetermined period is greater than a predetermined first reference value.

3. The method of claim 1, further comprising a step of continuously receiving, by the gateway device, the additional power consumption information of the electronic device from the smart plug after requesting the additional power consumption information.

4. The method of claim 1, wherein the step of controlling the data transmission of at least some of the smart plugs transmitting the additional power consumption information to the gateway device comprises:
determining, by the gateway device, a power consumption pattern of each smart plug based on the additional power consumption information received from the smart plug;
storing, by the gateway device, the determined power consumption pattern;
determining, by the gateway device, whether the stored power consumption pattern is identical to a previously stored power consumption pattern by comparing the stored power consumption pattern to the previously stored power consumption pattern; and
requesting, by the gateway device, a transmission stop of the additional power consumption information from a corresponding smart plug if it is determined that the stored power consumption pattern is identical to the previously stored power consumption pattern.

5. The method of claim 1, wherein the step of controlling the data transmission of at least some of the smart plugs transmitting the additional power consumption information to the gateway device comprises:

generating, by the gateway device, information specifying a time interval in which data is to be transmitted with respect to each smart plug;

transmitting, by the gateway device to a corresponding smart plug, the generated information specifying the time interval in which the data is to be transmitted to a corresponding smart plug; and receiving, by the gateway device, the data comprising the additional power consumption information from each smart plug based on the generated information specifying the time interval in which the data is to be transmitted.

6. The method of claim 1, further comprising:

determining, by the gateway device, device information of the electronic device connected to the smart plug based on the received additional power consumption information;

receiving, by the gateway device, a request for the device information about at least one electronic device connected to the smart plug; and providing, by the gateway device, the requested device information about the at least one electronic device.

7. A gateway device controlling a data transmission of a smart plug, the gateway device comprising:

a communication unit transmitting/receiving data to/from the smart plug; and a controller periodically receiving from the smart plug power consumption information of an electronic device connected to the smart plug, determining whether additional power consumption information of the electronic device is necessary based on the received power consumption information, requesting the additional power consumption information from the smart plug if it is determined that the additional power consumption information is necessary, determining a maximum number of smart plugs capable of transmitting the additional power consumption information to the gateway device, determining whether a number of smart plugs transmitting the additional power consumption information to the gateway device is greater than the maximum number, and controlling the data transmission of at least some of the smart plugs transmitting the additional power consumption information to the gateway device if the number of smart plugs transmitting the additional power consumption information to the gateway device is greater than the maximum number.

8. The gateway device of claim 7, wherein the controller determines that the additional power consumption information is necessary if an increment of an amount of power consumed by the electronic device for a predetermined period is greater than a predetermined first reference value.

9. The gateway device of claim 7, wherein the controller continuously receives the additional power consumption information of the electronic device from the smart plug after requesting the additional power consumption information.

10. The gateway device of claim 7, wherein the controller:

determines a power consumption pattern of each smart plug based on the additional power consumption information from the smart plug, stores the determined power consumption pattern, determines whether the stored power consumption pattern is identical to a previously stored power consumption pattern by comparing the stored power consumption pattern to the previously stored power consumption pattern, and requests a transmission stop of the additional power consumption information from a corresponding smart plug if it is determined that the stored power consumption pattern is identical to the previously stored power consumption pattern.

11. The gateway device of claim 7, wherein the controller:

generates information specifying a time interval in which data is to be transmitted with respect to each smart plug, transmits the generated information specifying the time interval in which the data is to be transmitted to a corresponding smart plug, and receives the data comprising the additional power consumption information from each smart plug based on the generated information specifying the time interval in which the data is to be transmitted.

12. The gateway device of claim 7, wherein the controller:

determines device information of the electronic device connected to the smart plug based on the received additional power consumption information, receives a request for the device information about at least one electronic device connected to the smart plug, and provides the requested device information about the at least one electronic device.

* * * * *